United States Patent
Chen et al.

(10) Patent No.: US 11,876,532 B1
(45) Date of Patent: Jan. 16, 2024

(54) METHOD AND APPARATUS FOR DETERMINING BIT-ERROR RATE IN A DATA CHANNEL

(71) Applicant: Marvell Asia Pte Ltd, Singapore (SG)

(72) Inventors: Yuanjie Chen, Saratoga, CA (US); Davide Visani, San Jose, CA (US); Min Wu, San Jose, CA (US)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 17/815,415

(22) Filed: Jul. 27, 2022

Related U.S. Application Data

(60) Provisional application No. 63/227,173, filed on Jul. 29, 2021.

(51) Int. Cl.
| | | |
|---|---|---|
| *H03M 13/01* | (2006.01) | |
| *H03M 13/11* | (2006.01) | |
| *H03M 13/15* | (2006.01) | |

(52) U.S. Cl.
CPC ....... *H03M 13/015* (2013.01); *H03M 13/1111* (2013.01); *H03M 13/1515* (2013.01)

(58) Field of Classification Search
CPC .................................................. H03M 13/015
See application file for complete search history.

(56) References Cited

U.S. PATENT DOCUMENTS

| | | | | |
|---|---|---|---|---|
| 5,694,404 A | * | 12/1997 | Huang ...................... | G06F 5/14 714/751 |
| 8,560,900 B1 | * | 10/2013 | Bellorado ........ | G11B 20/10296 714/741 |
| 11,494,114 B1 | * | 11/2022 | Eisenhuth ............. | G06F 3/0679 |
| 2004/0030965 A1 | * | 2/2004 | Hadjihassan ............ | H04L 1/20 714/704 |
| 2006/0002689 A1 | * | 1/2006 | Yang ................ | G11B 20/10009 |
| 2009/0210776 A1 | * | 8/2009 | Cho .................... | G06F 11/1072 714/E11.032 |
| 2012/0254699 A1 | * | 10/2012 | Ruby ................... | G11C 29/028 714/E11.034 |
| 2013/0007562 A1 | * | 1/2013 | Fai ...................... | G06F 11/1004 710/305 |

* cited by examiner

*Primary Examiner* — Joseph D Torres

(57) ABSTRACT

A method for determining a bit-error rate in data received on high-speed data channel that uses a forward-error-correcting decoder includes receiving at receiver circuitry on the high-speed data channel a received predetermined data pattern, comparing, bit-wise, the received predetermined data pattern to a locally generated copy of the predetermined data pattern to derive output bits representing whether there was an error in a corresponding bit of the received predetermined data pattern, to determine error bits in the received predetermined data pattern, grouping output bits from the comparing into symbols and codewords, and for each codeword for which a count of symbols containing errors exceeds a number of symbols correctable by the forward-error-correcting decoder, counting a total number of bit errors contained in the symbols containing errors, for use in adjusting the receiver circuitry in response to the total number of bit errors.

16 Claims, 7 Drawing Sheets

METHOD AND APPARATUS FOR DETERMINING BIT-ERROR RATE IN A DATA CHANNEL

CROSS REFERENCE TO RELATED APPLICATION

This disclosure claims the benefit of commonly-assigned U.S. Provisional Patent Application No. 63/227,173, filed Jul. 29, 2021, which is hereby incorporated by reference herein in its entirety.

FIELD OF USE

This disclosure relates to determining the bit-error rate in a data channel. More particularly, this disclosure relates to determining the contribution of an uncorrected channel to the bit-error rate of an error-correcting decoder of a receiver on the channel, to enable adjustment of parameters of the receiver.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

High-speed serial data links, such as, e.g., an Ethernet data channel, may be encoded using error-correcting codes. For example, the transmit portion of an Ethernet physical layer transceiver (PHY) may include a forward-error-correcting encoder such as a Reed-Solomon encoder, while the receive portion of the Ethernet PHY includes a corresponding forward-error-correcting decoder such as a Reed-Solomon decoder. Thus, at either end of an Ethernet link, data may be encoded by a Reed-Solomon encoder for transmission onto the link, and at the respective other end of the Ethernet link, the received data may be decoded by a Reed-Solomon decoder. Errors introduced as a result of channel conditions may be corrected by the Reed-Solomon decoder (or other error-correcting decoder). However, an error-correcting decoder can correct only a certain number of symbol errors in each codeword. Therefore, it is important to know the bit-error rate of the channel so that receiver parameters can be adjusted to keep the number of errors in the received signal from exceeding the number of errors than can be corrected by the decoder.

SUMMARY

In accordance with implementations of the subject matter of this disclosure, a method for determining a bit-error rate in data received on high-speed data channel that uses a forward-error-correcting decoder includes receiving at receiver circuitry on the high-speed data channel a received predetermined data pattern, comparing, bit-wise, the received predetermined data pattern to a locally generated copy of the predetermined data pattern to derive output bits representing whether there was an error in a corresponding bit of the received predetermined data pattern, to determine error bits in the received predetermined data pattern, grouping output bits from the comparing into symbols and codewords, and for each codeword for which a count of symbols containing errors exceeds a number of symbols correctable by the forward-error-correcting decoder, counting a total number of bit errors contained in the symbols containing errors, for use in adjusting the receiver circuitry in response to the total number of bit errors.

A first implementation of such a method may further include dividing the total number of bit errors by a total number of bits received.

A first aspect of that first implementation may further include feeding back the bit error rate to the receiver circuitry, and adjusting the receiver circuitry to reduce the fed-back bit-error rate.

A second implementation of such a method may further include generating at the receiver circuitry the locally generated copy of the predetermined data pattern.

According to a first aspect of that second implementation, the receiving may include receiving a pseudorandom bit sequence.

In a first instance of the first aspect, the generating may include deriving a seed pattern from the received pseudorandom bit sequence, and seeding a local data pattern generator with the seed value to generate the locally generated copy of the pseudorandom bit sequence.

In a third implementation of such a method, the forward-error-correcting decoder may include a Reed-Solomon decoder with a block length n and a message length k, and the counting the total number of bit errors contained in the symbols containing errors may include counting the total number of bit errors contained in the symbols containing errors for each codeword for which a count of symbols containing errors exceeds $(n-k)/2$.

In accordance with implementations of the subject matter of this disclosure, a physical layer transceiver for a high-speed data channel includes a receive path including receiver circuitry having an input coupled to the high-speed data channel, a forward-error-correcting decoder, circuitry for selectably coupling an output of the receiver circuitry to one of (a) the forward-error-correcting decoder, and (b) a bit-error-rate determining path, the bit-error-rate determining path having comparison circuitry configured to compare, bit-wise, a received predetermined data pattern to a locally generated copy of the predetermined data pattern, to derive output bits representing whether there was an error in a corresponding bit of the received predetermined data pattern, to determine error bits in the received predetermined data pattern, and counter circuitry configured to group output bits from the comparing into symbols and codewords, and for each codeword for which a count of symbols containing errors exceeds a number of symbols correctable by the forward-error-correcting decoder, count a total number of bit errors contained in the symbols containing errors.

A first implementation of such a physical layer transceiver may further include feedback circuitry configured to feed back bit-error data to the receiver circuitry to reduce the bit errors.

In a second implementation of such a physical layer transceiver, the comparison circuitry may be configured to compare the received predetermined data pattern to the locally generated copy of the predetermined data pattern by subtraction.

According to a first aspect of that second implementation, the comparison circuitry may include Exclusive-OR circuitry having as inputs the received predetermined data pattern and the locally generated copy of the predetermined data pattern.

In a third implementation of such a physical layer transceiver, the comparison circuitry, configured to compare a received predetermined data pattern to a locally generated copy of the predetermined data pattern, may be configured to compare a received pseudorandom bit sequence containing bit errors to a locally generated copy of the pseudorandom bit sequence.

According to a first aspect of that third implementation, the receive path may further include circuitry configured to generate the locally generated copy of the pseudorandom bit sequence.

In a first instance of that first aspect, the circuitry configured to generate the locally generated copy of the pseudorandom bit sequence may include a local pseudorandom bit sequence generator, and circuitry for deriving, from the received pseudorandom bit sequence containing bit errors, a seed value for the local pseudorandom bit sequence generator.

A fourth implementation of such a physical layer transceiver may further include a transmit path including transmitter circuitry, a predetermined data pattern generator, and circuitry for selectably coupling, to the high-speed data channel, one of (a) output of the transmitter circuitry, and (b) output of the predetermined data pattern generator.

According to a first aspect of that fourth implementation, the predetermined data pattern generator may include circuitry configured to generate a pseudorandom bit sequence.

According to implementations of the subject matter of this disclosure, a method of operating a physical layer transceiver for a high-speed data channel, where the physical layer transceiver includes a receive path including receiver circuitry having an input coupled to the high-speed data channel, a forward-error-correcting decoder, and first circuitry for selectably coupling an output of the receiver circuitry to one of (a) the forward-error-correcting decoder, and (b) a bit-error-rate determining path, includes operating the first circuitry for selectably coupling in one of a data-receiving mode and an error-measurement mode, by selectably coupling an output of the receiver circuitry to the forward-error-correcting decoder in the data receiving mode; and selectably coupling the output of the receiver circuitry to the bit-error-rate determining path in an error-rate measurement mode.

A first implementation of such a method of operating may further include feeding back output of the bit-error-rate determining path to the receiver circuitry for adjusting the receiver circuitry to reduce the fed-back bit-error rate.

A second implementation of such a method of operating, where the physical layer transceiver further includes a transmit path including transmitter circuitry, a predetermined data pattern generator, and second circuitry for selectably coupling, to the high-speed data channel, one of (a) output of the transmitter circuitry, and (b) output of the predetermined data pattern generator, further includes operating the second circuitry for selectably coupling in one of a data transmission mode and the error-measurement mode, by selectably coupling an output of the transmitter circuitry to the high-speed data channel in the data transmission mode, and selectably coupling the output of the predetermined data pattern generator to the high-speed data channel in the error-rate measurement mode.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
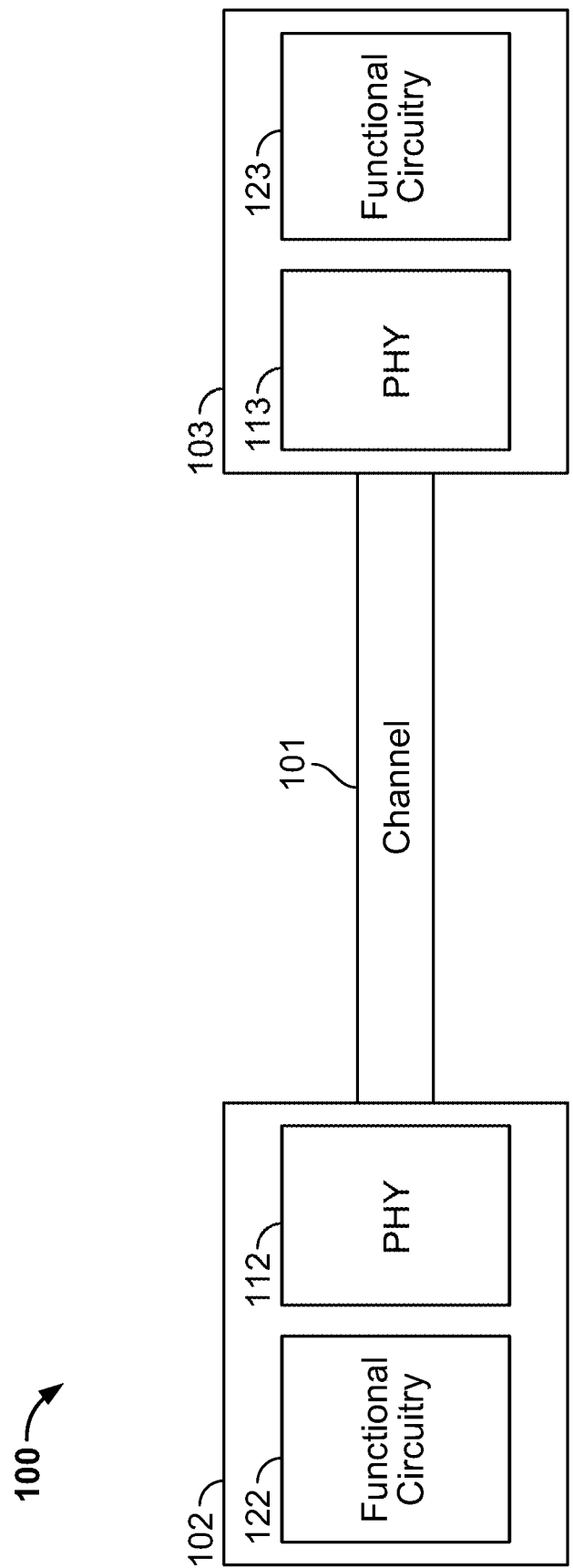
FIG. 1 is a simplified representation of an Ethernet link including physical layer transceivers incorporating the subject matter of this disclosure.

In some typical implementations, high-speed serial data links, such as, e.g., an Ethernet data channel, may be encoded using error-correcting codes. For example, the transmit portion of an Ethernet physical layer transceiver (PHY) may include a forward-error-correcting encoder such as a Reed-Solomon encoder, while the receive portion of the Ethernet PHY includes a corresponding forward-error-correcting decoder such as a Reed-Solomon decoder. Thus, at either end of an Ethernet link, data may be encoded by a Reed-Solomon encoder for transmission onto the link, and at the respective other end of the Ethernet link, the received data may be decoded by a Reed-Solomon decoder.

Errors introduced as a result of channel conditions may be corrected by the Reed-Solomon decoder (or other error-correcting decoder). However, an error-correcting decoder can correct only a certain number of symbol errors in each codeword. Therefore, it is important to know the bit-error rate of the channel so that receiver parameters can be adjusted to keep the number of errors in the received signal from exceeding the number of errors than can be corrected by the decoder. Heretofore, the bit-error rate as determined by Reed-Solomon decoder (or other error-correcting decoder) has taken into account the ratio of the number of uncorrectable error bits to the total number of bits. This does not take into account wrongly-decoded bits, because the decoder is not aware when the number of bit errors is too large for the decoder to correct, so that the decoder wrongly decodes one or more bits. Accordingly, it would be useful to determine the "true" bit-error rate upstream of the error-correcting decoder (this may be referred to as the pre-forward-error-correction bit-error rate, or pre-FEC bit-error rate), so that the pre-FEC bit-error rate can be lowered to a point that the error-correcting decoder can correct all errors.

In accordance with implementations of the subject matter of this disclosure, a pre-FEC bit-error rate may be determined by, in a test or measurement mode (e.g., during link setup or periodically during normal operation), sending a pseudorandom bit sequence (PRBS) from a remote transceiver without using the error-correcting encoder at the remote transceiver. At the local transceiver, the received PRBS signal may be processed, without using the local error-correcting decoder, to derive a PRBS seed sequence for a local PRBS generator that functions identically to the remote PRBS generator. The mathematics of PRBS generation is such that the PRBS seed sequence can be determined from the received PRBS signal notwithstanding errors in the received PRBS signal.

Once the PRBS seed sequence has been determined and input to the local PRBS generator, the output of the local PRBS generator should be identical to the PRBS signal sent by the remote transceiver. Comparing the received PRBS signal to the locally generated PRBS signal—e.g., by subtraction (which may be implemented using an Exclusive-OR function)—should therefore be the same as comparing the received PRBS signal to the remotely generated PRBS signal, and any differences between the received PRBS signal and the locally generated PRBS signal can be attributed to pre-FEC bit errors introduced by the channel. The differences can be represented as test bits, each of which indicates whether a corresponding received bit was correct or incorrect.

Once the test bits, representing pre-FEC bit errors, are determined, the test bits can be grouped into test symbols (e.g., 10 bits per symbol) and the test symbols can be grouped into test codewords (e.g., 544 symbols per codeword). Each test codeword can be examined to see if it contains too many test symbols containing errors in test bits. For a Reed-Solomon code with a block length n and a message length k, the maximum number T of erroneous symbols that can be corrected in a single codeword is $T=(n-k)/2$. Therefore, if any of the test codewords contains more than T erroneous symbols, the local receiver may be adjusted (e.g., parameters of filters such as demodulators, equalizers, crosstalk cancellers, etc., may be adjusted) in an attempt to reduce the number of erroneous test symbols per codeword.

A physical layer transceiver in accordance with implementations of the subject matter of this disclosure may contain, in the receive path, a receiver (including the aforementioned demodulator, equalizer, crosstalk cancellers, etc.) and a switch selectably coupling the receiver output either, in an operation mode, to a Reed-Solomon decoder (or other FEC decoder) to decode output data from the demodulated received signal, or, in a test/measurement mode, to a pre-FEC bit-error rate measurement path.

Implementations of the pre-FEC bit-error rate measurement path may include a local PRBS generator, and a PRBS monitor circuit that monitors a received PRBS signal and is able to derive a seed value for the local PRBS generator so that the local PRBS generator can provide a local PRBS signal that matches the received PRBS signal as transmitted. The mathematics of PRBS generation allow derivation of a valid seed value even if there are errors in the received PRBS signal. These implementations of the pre-FEC bit-error rate measurement path also include circuitry to perform a bit-wise comparison of the received PRBS signal to the locally generated PRBS signal (which, as noted, should be a match to the received signal as originally transmitted) to derive the bit errors in the received PRBS signal. This comparison circuitry may perform subtraction of one signal from the other and may be implemented as an Exclusive-OR circuit or other suitable logic, which outputs, for each received bit, a test bit that indicates whether the received bit was correct or incorrect. For example, in some implementations, if the received bit were correct, the test bit could be '0' while if the received bit were incorrect that bit could be '1'.

These implementations of the pre-FEC bit-error rate measurement path further include counter circuitry to group the test bits into test symbols, and the test symbols into test codewords. In the foregoing example, for any test symbol whose underlying received bits were all correct, each bit in the test symbol would be a '0', while for any test symbol in which there was an error in one or more received bits, at least one bit would be a '1'. The counter circuitry therefore identifies any test symbol that contains at least one '1' as an error symbol, and counts the number of error symbols in each test codeword. For each test codeword in which the number of error symbols exceeds the aforementioned threshold T, a codeword accumulator is incremented. If the value in the accumulator is not '0', meaning that at least one codeword includes more errors than can be corrected by the FEC decoder, then the receiver parameters may be adjusted to lower the number of errors and therefore to lower the value in the accumulator.

Because any PHY in accordance with implementations of the subject matter of this disclosure may also be used at the transmit end of a link, each PHY may include, in the transmit path of the PHY, a Reed-Solomon encoder (or other FEC encoder) as well as a PRBS generator, and a transmitter. A switch selectably couples, in an operation mode, the Reed-Solomon encoder, or, in the test/measurement mode, the PRBS generator, to the transmitter.

The true bit-error rate is equal to:

$$\frac{\text{(number of uncorrectable error bits + number of wrongly-decoded bits)}}{\text{(total number of bits)}}$$

However, because the decoder does not recognize the wrongly-decoded bits, the bit-error rate output by a Reed-Solomon decoder (or other FEC decoder) is equal to:

$$\text{(number of uncorrectable error bits)/(total number of bits)}$$

However, it can be shown that the $$\frac{\text{(number of error bits when number of symbol errors per codeword} > T)}{\text{(total number of bits)}}$$

is equivalent to the true bit-error rate described above.

Various statistics may be derived from the bit-error rate measurement path. These include the pre-FEC bit-error rate, which is the total number of bit errors detected. In addition, for each codeword, the number of symbols containing bit errors may be recorded in histogram form, with the largest number of error symbols in any codeword being referred to as max-T, and the pattern of bit errors and symbol errors in that codeword having max-T may also be determined. These data may be fed back, as described above, to adjust the receiver parameters to reduce bit errors.

The subject matter of this disclosure may be better understood by reference to FIGS. 1-7.

FIG. 1 is a simplified representation of an Ethernet link 100 including PHYs incorporating the subject matter of this disclosure. Ethernet link 100 includes a wireline channel medium 101 which may be, e.g., an optical fiber cable, a coaxial cable, or a shielded or unshielded twisted pair cable coupled to functional circuitry 122, 123 of a respective one of two nodes 102, 103 by respective PHYs 112, 113.

Figure 2:
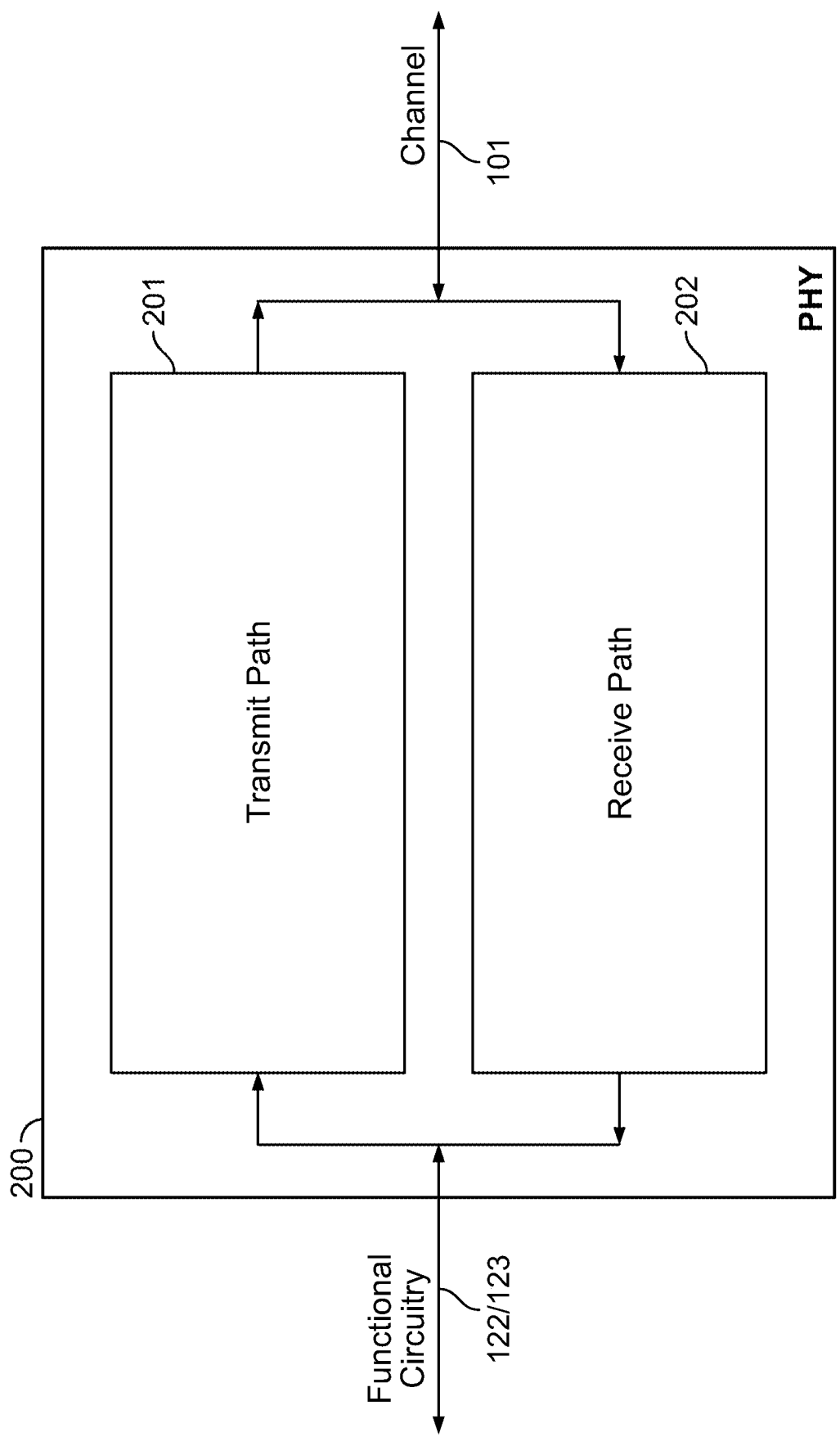
FIG. 2 is a simplified representation of a physical layer transceiver incorporating the subject matter of this disclosure.

Each of PHYs 112, 113 may have the structure 200 shown in simplified form in FIG. 2, including a transmit path 201 and a receive path 202, which are essentially independent of each other.

Figure 3:
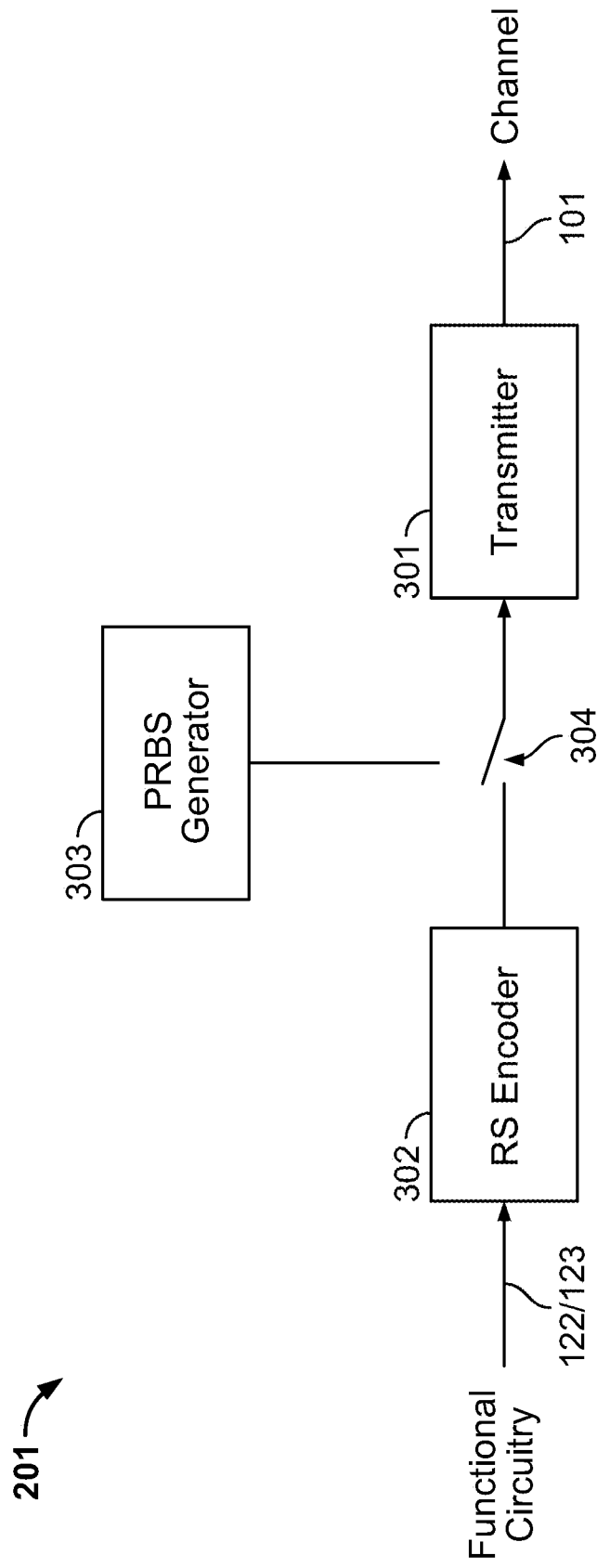
FIG. 3 is a simplified representation of a transmit path in a physical layer transceiver incorporating the subject matter of this disclosure.

As seen in FIG. 3, transmit path 201 may include a transmitter 301 for coupling to channel medium 101, as well as a forward-error-correcting encoder 302 (which may be a Reed-Solomon encoder 302, as shown) and a PRBS generator 303. FEC encoder 302 is configured to receive data at 312 from functional circuitry 122 or 123 of node 102 or 103. A switch 304 is provided for selectably coupling either FEC encoder 302 or PRBS generator 303 to transmitter 301.

Figure 4:
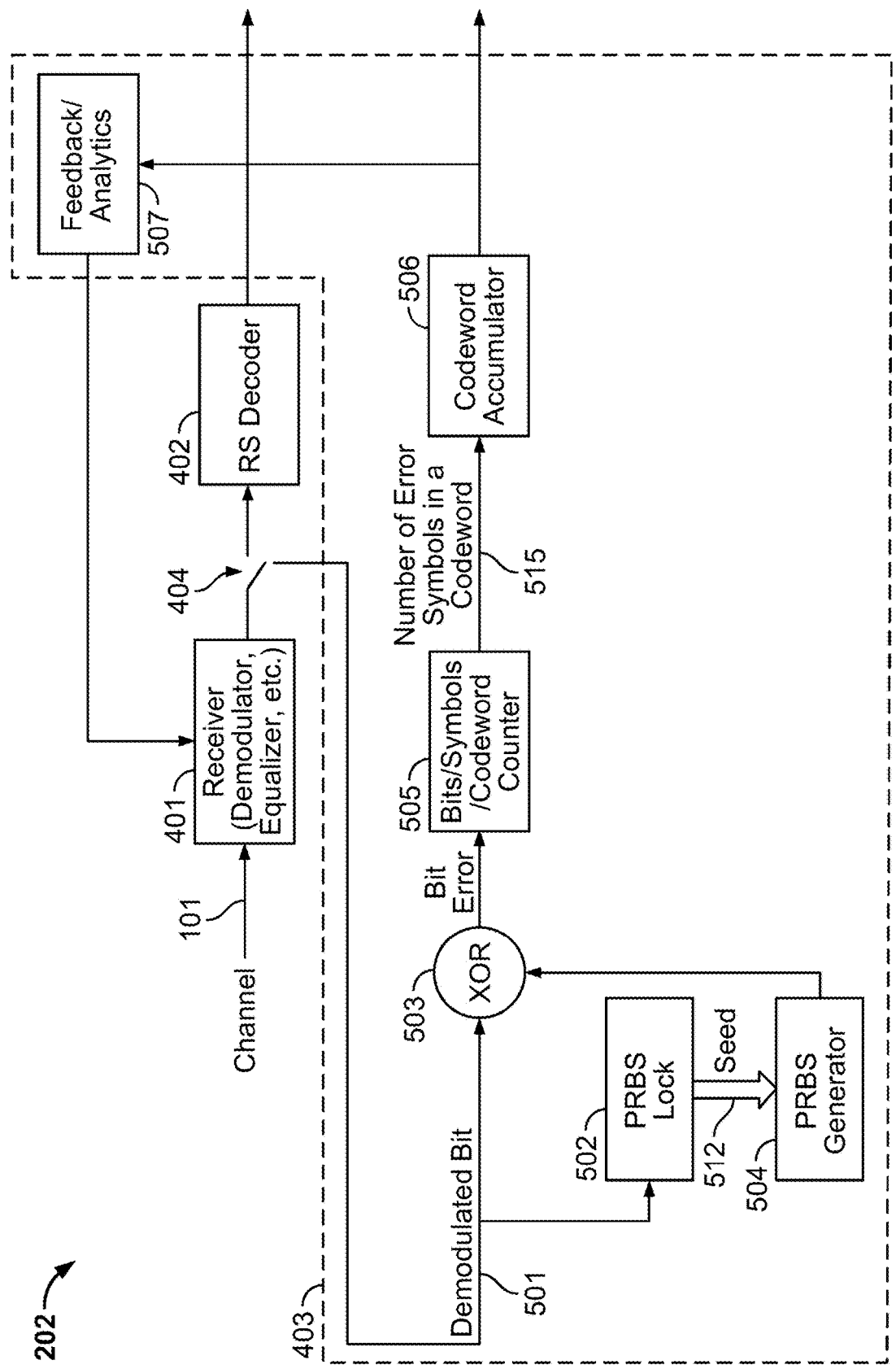
FIG. 4 is a simplified representation of a receive path in a physical layer transceiver incorporating the subject matter of this disclosure.

As seen in FIG. 4, receive path 202 may include a receiver 401 for coupling to channel medium 101, as well as a forward-error-correcting decoder 402 (which may be a Reed-Solomon decoder 402, as shown) and a pre-FEC bit-error rate measurement path 403. A switch 404 is provided for selectably coupling either FEC decoder 402 or pre-FEC bit-error rate measurement path 403 to receiver 401.

In normal operating mode, switch 304 in each of nodes 102, 103 is set to couple the respective FEC encoder 302 to respective transmitter 301, while switch 404 in each of nodes 102, 103 is set to couple the respective FEC decoder 402 to respective receiver 401. Thus, a first data path is set up between FEC encoder 302 of node 102 and FEC decoder 402 of node 103 and a reciprocal second data path is set up between FEC encoder 302 of node 103 and FEC decoder 402 of node 102.

Alternatively, in a setup/training/calibration mode, switch 304 in each of nodes 102, 103 is set to couple the respective PRBS generator 303 to respective transmitter 301, while switch 404 in each of nodes 102, 103 is set to couple the respective pre-FEC bit-error rate measurement path 403 to respective receiver 401. Thus, a first data path is set up between PRBS generator 303 of node 102 and pre-FEC bit-error rate measurement path 403 of node 103 to allow measurement of the pre-FEC bit-error rate in node 103, and a reciprocal second data path is set up between PRBS generator 303 of node 103 and pre-FEC bit-error rate measurement path 403 of node 102 to allow measurement of the pre-FEC bit-error rate in node 102.

Figure 5:
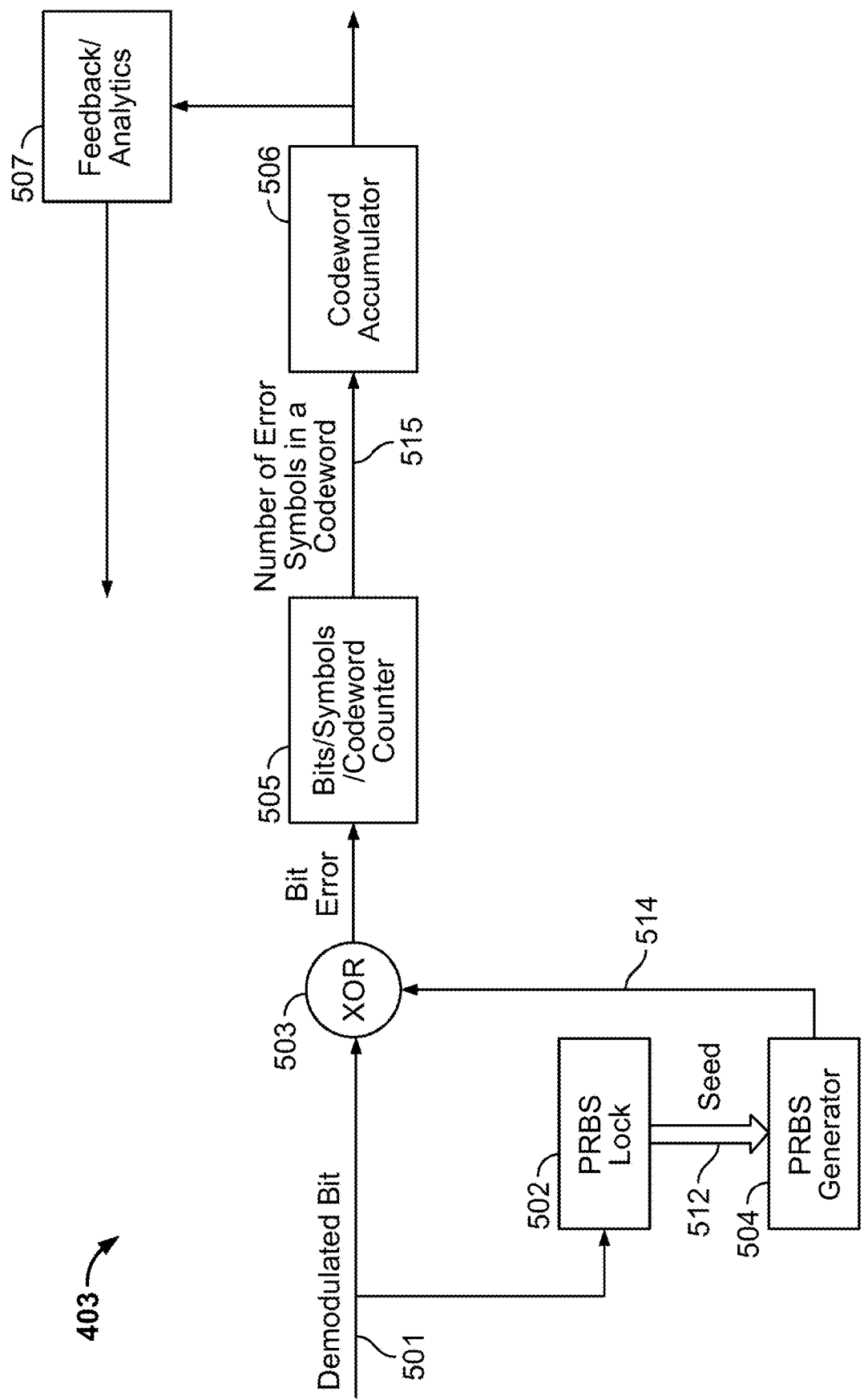
FIG. 5 represents bit-error rate measurement path in a receive path, such as that shown in FIG. 4, in a physical layer transceiver incorporating the subject matter of this disclosure.

Pre-FEC bit-error rate measurement path 403 may have the structure 500 seen in FIG. 5. Input 501 which couples to switch 404, also is coupled to PRBS lock circuitry 502 and to Exclusive-OR gate 503. An output 512 of PRBS lock circuitry 502 is input to local PRBS generator 504, and the output 514 of PRBS generator 504 is a second input to Exclusive-OR gate 503. The output of Exclusive-OR gate 503 is coupled to counter 505, and the output 515 of counter 505 is coupled to codeword accumulator 506. The output of codeword accumulator 506 is coupled to feedback/analytics circuitry 507 which may be coupled to receiver 401.

Figure 6:
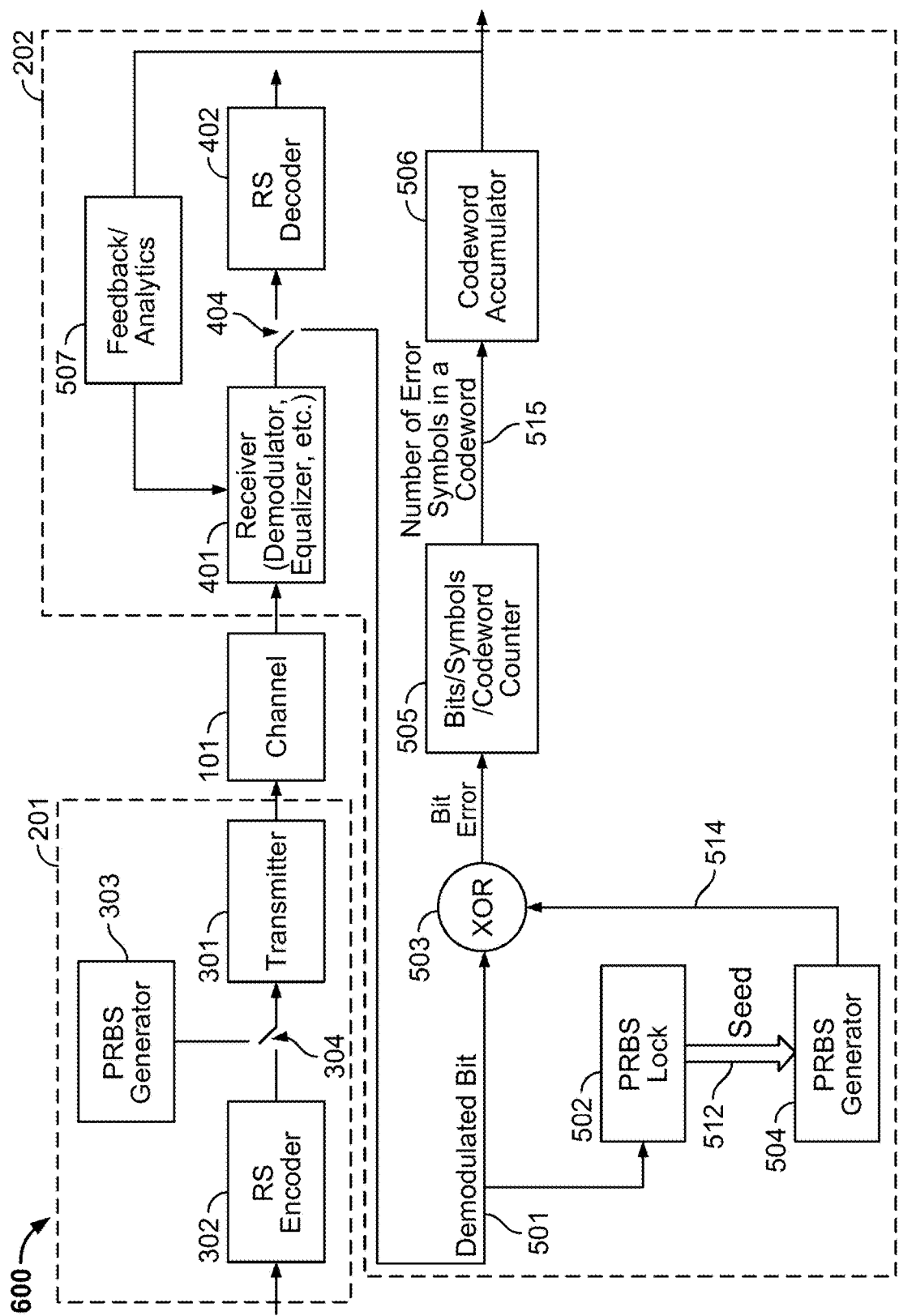
FIG. 6 represents a datapath including the transmit path of one physical layer transceiver and the receive path of another physical layer transceiver, in accordance with the subject matter of this disclosure.

FIG. 6 shows an implementation of a datapath 600, including the transmit path 201 of a first one of PHYs 112, 113, the channel medium 101, and the receive path 202 of a second one of PHYs 112, 113. In such an implementation, there would normally also be a reciprocal datapath (not shown) in the other direction, incorporating the transmit path 201 of the second one of PHYs 112, 113, the channel medium 101, and the receive path 202 of the first one of PHYs 112, 113.

In operation, when in any datapath such as datapath 600, switch 304 selects PRBS generator 303 and switch 404 selects pre-FEC bit-error rate measurement path 403, a PRBS pattern output by PRBS generator 303 is transmitted via transmitter 301 onto channel medium 101, and is input to receiver 401 where the PRBS pattern is demodulated and filtered (using equalizers, echo cancellers, etc.) and input as a serial signal (one bit at a time) to both PRBS lock circuitry 502 and to Exclusive-OR gate 503. Because of the mathematics of PRBS generation, after a certain number of bits have been received, even with bit errors, PRBS lock circuitry 502 is able to lock onto the transmitted PRBS pattern and output a seed value at 512. The seed value at 512 is input to local PRBS generator 504, which uses the seed value to generate a replica 514 of the PRBS pattern transmitted from remote PRBS generator 303.

In this implementation, Exclusive-OR gate 503 performs a bit-wise comparison of the received version of the originally-transmitted PRBS pattern to the replica pattern 514, outputting a first test bit value (e.g., '0') when the received version of the originally-transmitted PRBS pattern is identical to the replica pattern 514 meaning there is no error in the current bit, and outputting a second test bit value (e.g., '1') when the received version of the originally-transmitted PRBS pattern is different from the replica pattern 514 meaning there is an error in the current bit.

The test bit values (in this implementation, '1' representing a bit error and '0' representing no bit error) are grouped by counter 505 into test symbols (e.g., 10 bits/symbol), and the test symbols are grouped into test codewords (e.g., 255 symbols/codeword). In this implementation, any symbol containing a '1' in any bit is a symbol containing an error (i.e., is an "error symbol"), while symbols containing only a '0' in each bit is error-free. Counter 505 counts the bits that are '1' in each symbol, outputting at 515 a value indicating that the current codeword contains error symbols, and the number of error symbols in each codeword. Codeword accumulator 506 increments each time an error symbol is detected, outputting an error indication whenever the number of error symbols in a codeword, as output by counter 505, exceeds the aforementioned value T. The number of error symbols is passed on to feedback/analytics circuitry 507.

Feedback/analytics circuitry 507 may derive various error statistics from the error indications received from codeword accumulator 506, allowing an operator to decide whether to adjust the filters (equalizers, crosstalk filters, echo cancellers, etc.) in receiver 305 to reduce the bit-error rate. Alternatively, or additionally, feedback/analytics circuitry 507 may make its own determination, based on programmed logic, to adjust the filters in receiver 401 to reduce the bit-error rate. As a further alternative, the error value may be fed back directly to receiver 401 which would adjust its filters whenever the error value is non-zero.

Figure 7:
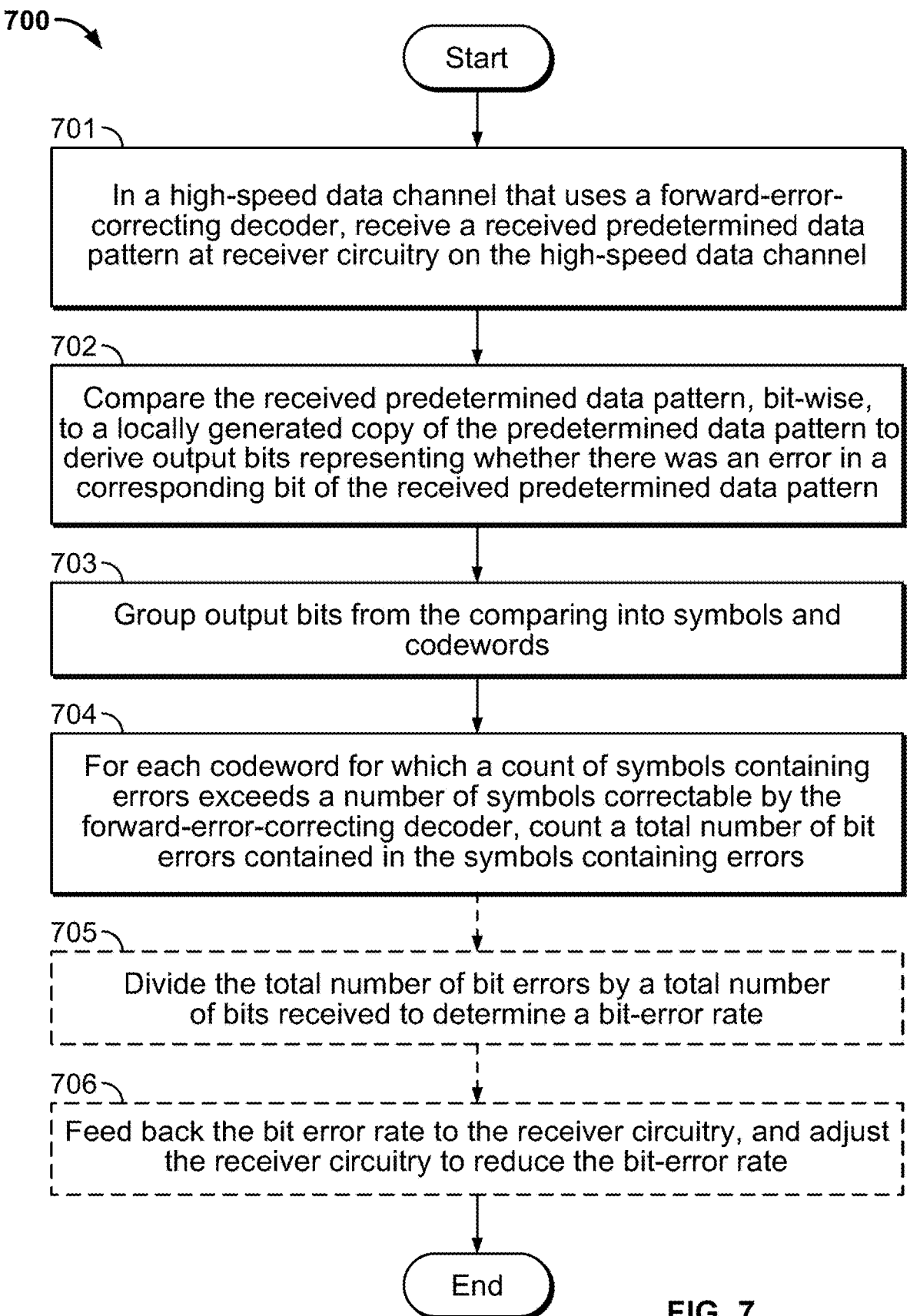
FIG. 7 is a flow diagram illustrating a method in accordance with implementations of the subject matter of this disclosure.

A method 700 according to implementations of the subject matter of this disclosure is diagrammed in FIG. 7. Method 700 begins at 701, where in a high-speed data channel that uses a forward-error-correcting decoder, a received predetermined data pattern is received at receiver circuitry on the high-speed data channel. At 702, the received predetermined data pattern is compared, bit-wise, to a locally generated copy of the predetermined data pattern to derive output bits representing whether there was an error in a corresponding bit of the received predetermined data pattern, to determine error bits in the received predetermined data pattern. At 703, output bits from the comparing are grouped into symbols and codewords. At 704, for each codeword for which a count of symbols containing errors exceeds a number of symbols correctable by the forward-error-correcting decoder, a total number of bit errors contained in the symbols containing errors is counted. Optionally at 705, a bit-error rate is determined by dividing the total number of bit errors by a total number of bits received. As a further option at 706, the bit error rate is fed back to the receiver circuitry, and receiver circuitry is adjusted to reduce the bit-error rate, and method 700 ends.

Thus it is seen that a method and apparatus for determining the contribution of an uncorrected channel to the bit-error rate of an error-correcting decoder of a receiver on the channel, to enable adjustment of parameters of the receiver, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for determining a bit-error rate in data received on high-speed data channel that uses a forward-error-correcting decoder, the method comprising:
receiving at receiver circuitry on the high-speed data channel a received predetermined data pattern;
comparing, bit-wise, the received predetermined data pattern to a locally generated copy of the predetermined data pattern to derive output bits representing whether there was an error in a corresponding bit of the received predetermined data pattern, to determine error bits in the received predetermined data pattern;
grouping output bits from the comparing into symbols and codewords; and
for each codeword for which a count of symbols containing errors exceeds a number of symbols correctable by the forward-error-correcting decoder, counting a total number of bit errors contained in the symbols containing errors, for use in adjusting the receiver circuitry in response to the total number of bit errors.

2. The method for determining a bit-error rate according to claim 1, further comprising dividing the total number of bit errors by a total number of bits received.

3. The method for determining a bit-error rate according to claim 2, further comprising:
feeding back the bit error rate to the receiver circuitry; and
adjusting the receiver circuitry to reduce the fed-back bit-error rate.

4. The method for determining a bit-error rate according to claim 1 further comprising generating at the receiver circuitry the locally generated copy of the predetermined data pattern.

5. The method for determining a bit-error rate according to claim 4, wherein the receiving comprises receiving a pseudorandom bit sequence.

6. The method for determining a bit-error rate according to claim 5, wherein the generating comprises:
deriving a seed pattern from the received pseudorandom bit sequence; and
seeding a local data pattern generator with the seed value to generate the locally generated copy of the pseudorandom bit sequence.

7. The method for determining a bit-error rate according to claim 1 wherein:
the forward-error-correcting decoder comprises a Reed-Solomon decoder with a block length n and a message length k; and
the counting the total number of bit errors contained in the symbols containing errors comprises counting the total number of bit errors contained in the symbols containing errors for each codeword for which a count of symbols containing errors exceeds (n–k)/2.

8. A physical layer transceiver for a high-speed data channel, the physical layer transceiver comprising:
a receive path including:
receiver circuitry having an input coupled to the high-speed data channel;
a forward-error-correcting decoder;
circuitry for selectably coupling an output of the receiver circuitry to one of (a) the forward-error-correcting decoder, and (b) a bit-error-rate determining path, the bit-error-rate determining path having:
comparison circuitry configured to compare, bit-wise, a received predetermined data pattern to a locally generated copy of the predetermined data pattern, to derive output bits representing whether there was an error in a corresponding bit of the received predetermined data pattern, to determine error bits in the received predetermined data pattern, and
counter circuitry configured to:
group output bits from the comparing into symbols and codewords, and
for each codeword for which a count of symbols containing errors exceeds a number of symbols correctable by the forward-error-correcting decoder, count a total number of bit errors contained in the symbols containing errors.

9. The physical layer transceiver of claim 8 further comprising feedback circuitry configured to feed back bit-error data to the receiver circuitry to reduce the bit errors.

10. The physical layer transceiver of claim 8 wherein the comparison circuitry is configured to compare the received predetermined data pattern to the locally generated copy of the predetermined data pattern by subtraction.

11. The physical layer transceiver of claim 10 wherein the comparison circuitry comprises Exclusive-OR circuitry having as inputs the received predetermined data pattern and the locally generated copy of the predetermined data pattern.

12. The physical layer transceiver of claim 8 wherein the comparison circuitry, configured to compare a received predetermined data pattern to a locally generated copy of the predetermined data pattern, is configured to compare a received pseudorandom bit sequence containing bit errors to a locally generated copy of the pseudorandom bit sequence.

13. The physical layer transceiver of claim 12 wherein the receive path further comprises circuitry configured to generate the locally generated copy of the pseudorandom bit sequence.

14. The physical layer transceiver of claim 13 wherein the circuitry configured to generate the locally generated copy of the pseudorandom bit sequence comprises:
a local pseudorandom bit sequence generator; and
circuitry for deriving, from the received pseudorandom bit sequence containing bit errors, a seed value for the local pseudorandom bit sequence generator.

15. The physical layer transceiver of claim 8 further comprising:
a transmit path comprising:
transmitter circuitry;
a predetermined data pattern generator; and
circuitry for selectably coupling, to the high-speed data channel, one of (a) output of the transmitter circuitry, and (b) output of the predetermined data pattern generator.

16. The physical layer transceiver of claim 15 wherein the predetermined data pattern generator comprises circuitry configured to generate a pseudorandom bit sequence.

\* \* \* \* \*